Aug. 5, 1969 J. D. HARNDEN, JR 3,459,943

SILICON CONTROLLED RECTIFIER GATING CIRCUITS WITH A HIGH FREQUENCY TRIGGERING VOLTAGE AND PHOTOCELLS

Filed Feb. 6, 1967 4 Sheets-Sheet 1

Inventor:
John D. Harnden, Jr.
by Paul A. Frank
His Attorney.

Inventor:
John D. Harnden, Jr.
by Paul A. Frank
His Attorney.

Inventor:
John D. Harnden, Jr.
by Paul A. Frank
His Attorney.

Aug. 5, 1969 J. D. HARNDEN, JR 3,459,943

SILICON CONTROLLED RECTIFIER GATING CIRCUITS WITH A HIGH FREQUENCY TRIGGERING VOLTAGE AND PHOTOCELLS

Filed Feb. 6, 1967 4 Sheets-Sheet 4

Inventor:
John D. Harnden, Jr.
by Paul A. Frank
His Attorney.

United States Patent Office 3,459,943
Patented Aug. 5, 1969

3,459,943

SILICON CONTROLLED RECTIFIER GATING CIRCUITS WITH A HIGH FREQUENCY TRIGGERING VOLTAGE AND PHOTOCELLS

John D. Harnden, Jr., Schenectady, N.Y., assignor to General Electric Company, a corporation of New York Filed Feb. 6, 1967, Ser. No. 614,122
Int. Cl. H01j 39/12
U.S. Cl. 250—208 7 Claims

ABSTRACT OF THE DISCLOSURE

A family of low cost, light activated gating circuits are described for gating on power semiconductors of the thyristor type. The gating circuits include a light source for emitting light within the portion of the spectrum to which the light activated control elements respond together with means such as a fiber optic element for directing light from the light source onto the light sensitive surface of the light activated control element. Variable light interrupting means, such as a rotating apertured disk, are interposed in the light path between the light source and the light sensitive surface of the light activated control element for controlling turn on of the light activated control circuit. The light activated control element preferably comprises a light activated silicon controlled rectifier and the light source comprises an injection electroluminescent p-n junction light emitting diode.

This invention relates to new and improved low cost, light activated gating circuits.

More particularly, the invention relates to light activated gating circuits for gate controlled, power semiconductors which are simple and inexpensive to construct, and reliable in operation, and to semiconductor power circuits employing such gating circuits.

Gate controlled power semiconductors such as the silicon controlled rectifier and the triac have now come into widespread use throughout the industry for a variety of control purposes. The many technical fields where power semiconductors are employed for control purposes include motor controls of all types and sizes (i.e., machine tool motors, home appliance motors, hoist crane motors, etc.); heating controls; lighting controls; power generation and conversion equipment controls; etc. For all practical purposes it can be said that these power semiconductors find application in practically every kind of electrical equipment.

One of the characteristics of a gate controlled, power semiconductor of the type mentioned above is that it requires the application of a turn-on gating signal to its control gate electrode simultaneously with the application of an enabling potential across its load terminals, in order to be rendered conductive. A considerable amount of enginneering talent and effort has been directed to the development and manufacture of suitable gating circuits for this purpose. While a number of the gating circuits heretofore known have been satisfactorily used in a number of circuit applications, there is always room for improvement and it is the purposes of the present invention to provide such improved gating circuits. Some of the known gating circuits are too complex to facilitate easy manufacture and operation. Others are too expensive for use with low cost equipment such as home appliances. Still others are not sufficiently reliable in operation to justfy widespread adoption. To overcome these objections, the present, low cost, light activated gating circuits were devised.

It is therefore a primary object of the present invention to provide new and improved, low cost, light activated gating circuits for gate controlled power semiconductors which are simple and inexpensive to manufacture and operate, reduce cross-channel and noise interference effects, and are highly reliable in operation.

Another object of the invention is to provide new and improved gate controlled power semiconductor circuits employing such new and improved low cost light activated gating circuits.

In practicing the invention a low cost gating circuit for semiconductors of the light activated gate controlled type, is provided. This low cost light activated gating circuit is comprised by a light source for emitting light within the portion of the spectrum to which the light activated, gate controlled semiconductor responds. Means are provided for directing light from the light source onto the light sensitive junction of the light activated semiconductor. The low cost gating circuit is completed by a light interrupting means interposed in the light path between the light source and the light sensitive junction for controlling turn-on of the light activated semiconductor device. In preferred embodiments of the invention the light activated, semiconductor device comprises a light activated silicon controlled rectifier. A source of alternating current gating potential is operatively coupled across the load terminals of the light activated silicon control rectifier to cause conduction through the device upon the impingement of a light beam on its light sensitive junction. Also, it is preferred that the light source comprise a light emitting diode.

In addition to the above, the invention provides a light activated, controlled power circuit which includes an electrical load and at least one power rated, gate controlled, semiconductor device operatively coupling the electric load to a power source for controlling power supplied to the load. A low cost gating circuit having the characteristics outlined above is operatively coupled to and controls the gate controlled, power semiconductor device with the output from the light activated semiconductor device being operatively coupled to the control gate of the power semiconductor device for controlling the same. In preferred embodiments of the power circuit, a source of low voltage alternating current gating potential is supplied through a low voltage gating transformer having at least one secondary winding effectively coupled across the load terminals of the light activated semiconductor device through the control gate-cathode of the gate controlled, power semiconductor device. It is also possible for the power circuit to include a plurality of branch or subcircuits made up of power rated, gate controlled semiconductor devices and associated light activated, gate controlled semiconductor devices. In such arrangements, the low voltage gating transformer has a plurality of secondary windings, there being one secondary winding for each set of power rated and light activated semiconductor devices.

Other objects, features and many of the attendant advantages of this invention will be appreciated more readily as the same becomes better understood by reference to the following detailed description, when considered in connection with the accompanying drawings, wherein like parts in each of the several figures are identified by the same reference character, and wherein.

Figure 3:
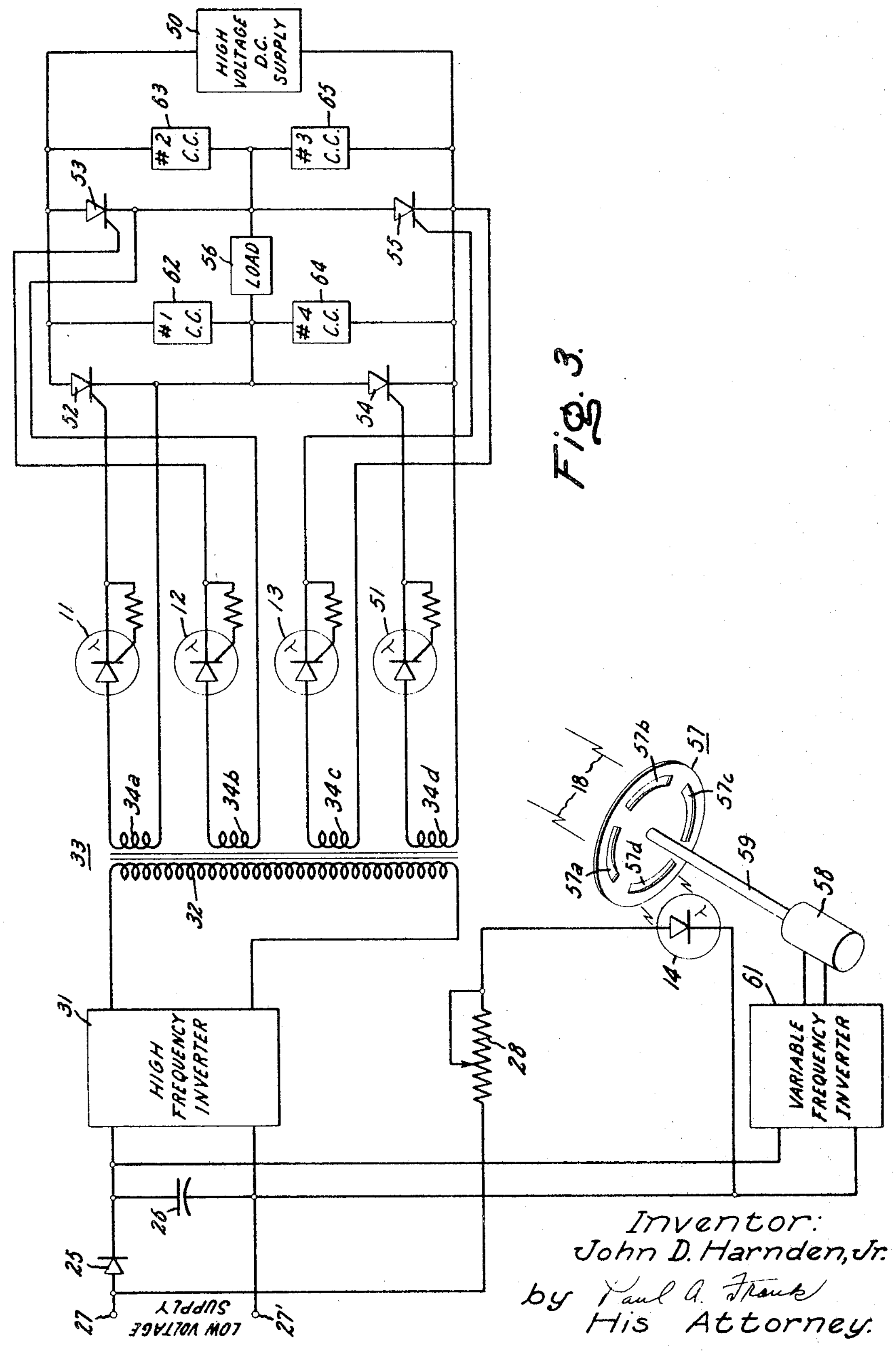
Figure 4:
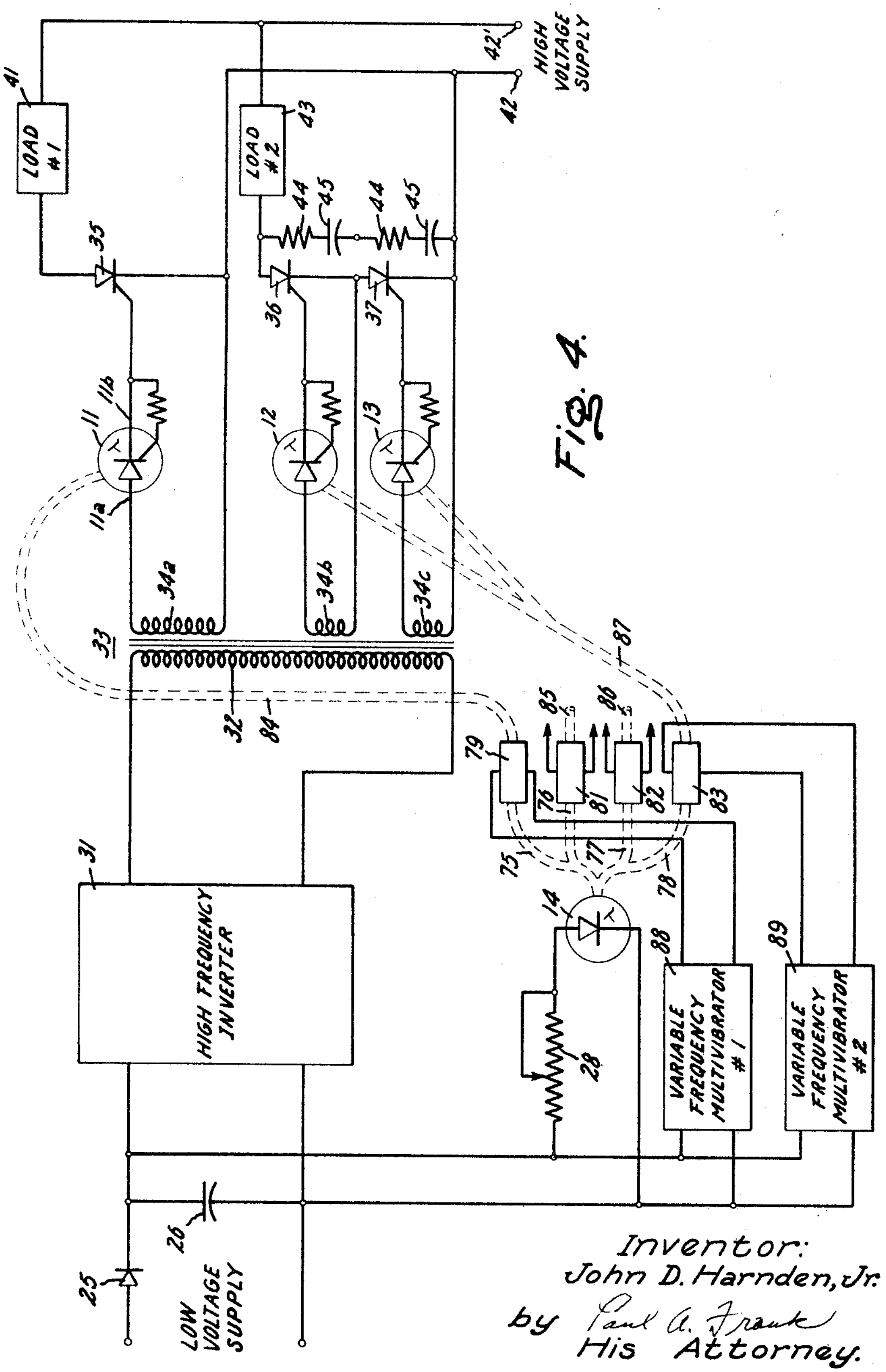

FIGURE 3 is a schematic circuit diagram of a modified form of a light controlled power circuit constructed in accordance with the invention and employing a low cost, light activated gating circuit comprising a part of the invention; and FIGURE 4 is a schematic circuit diagram of still a different form of light controlled power circuit according to the invention which employs a new low cost, light activated gating circuit using electrically operated light modulators.

Figure 1:
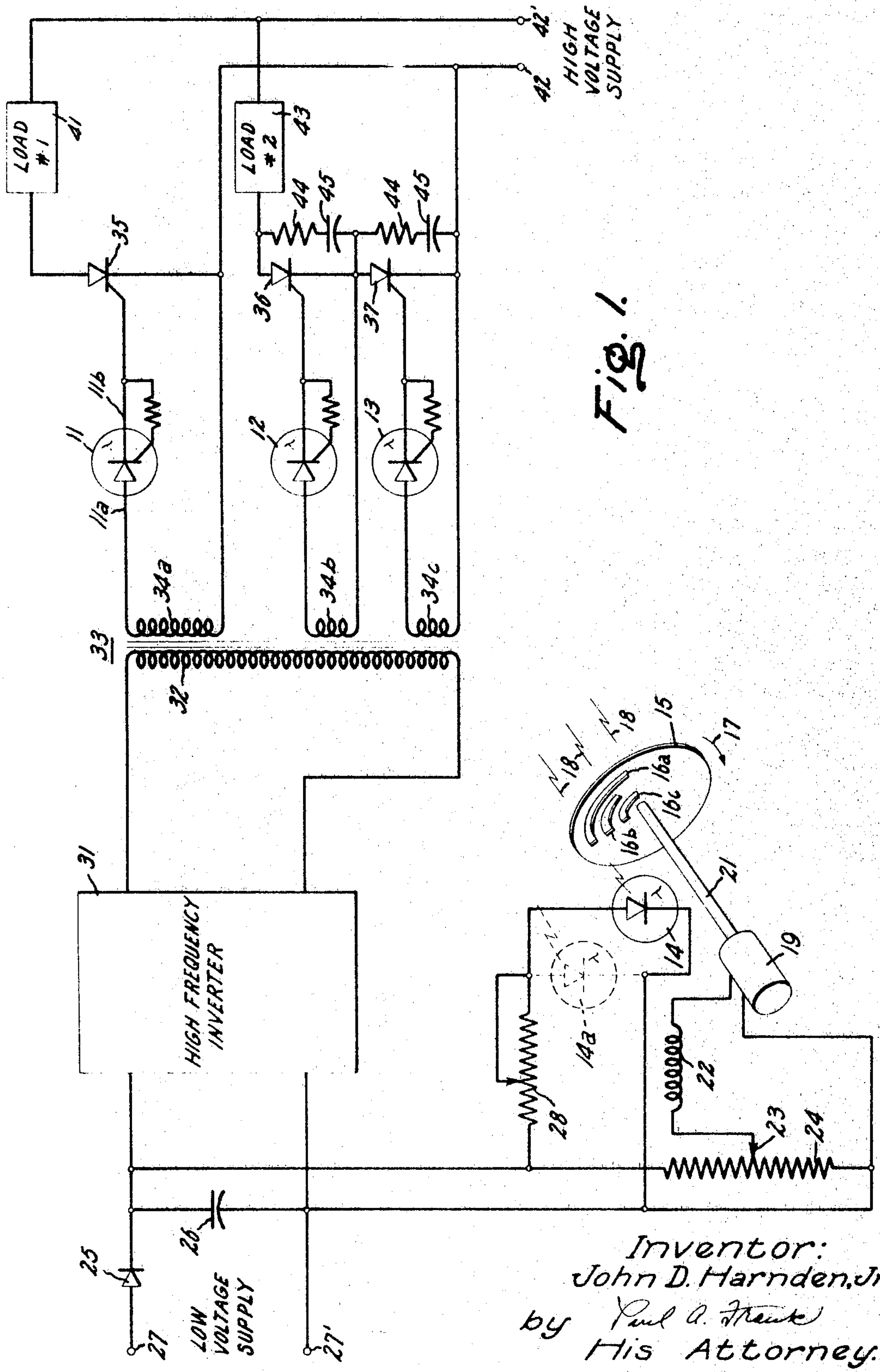
FIGURE 1 is a schematic circuit diagram of a light controlled power circuit constructed according to the invention, and employing a low cost, light activated gating circuit comprising a part of the present invention.

FIGURE 1 of the drawings illustrates a light controlled power circuit employing a low cost, light-activated gating circuit constructed in accordance with the invention. The low cost, light activated gating circuit utilizes at least one light activated, gate controlled semiconductor, a plurality of which are shown at 11, 12 and 13. The light activated gate controlled semiconductors preferably comprise gate controlled, light activated and silicon controlled rectifiers of the type illustrated and described in chapter 11 of the "Silicon Controlled Rectifier Manual," third edition, published by the Semiconductor Products Departemnt of the General Electric Company, Syracuse, N.Y. It should be understood that the invention is not to be limited to use with light activated silicon controlled rectifiers but could employ other light activated elements such as a light activated transistor, a light activated triac (bilateral semiconductor triode), a photoconductor, photoresistor, or any light activated four or five layer device.

The light activated silicon control rectifier (hereinafter referred to as a LASCR) in fact are small silicon control rectifiers provided with a glass window to permit triggering by means of light as well as by the application of a normal gate signal to its control gate electrode. These units are commercially available in voltage ratings from 25 volts to 200 volts and up, and differ generally from each other only in the amount of incident radiant energy (light) required to initiate switching. The gate may or may not be attached to the device. Thus, the devices comprise high speed power switches which can actuate directly solenoids, contactors, motors, lamps, etc. and because they are triggered by an incident light beam, they provide complete electrical isolation between the electrical power output and the control light input of the devices. Thus the LASCR has many advantages over other types of p-n-p-n switches. Operation and circuit handling of the LASCR is similar to the conventional electrically gated SCR with the exception that an external resistance, when used, is connected between the control gate electrode and cathode of the LASCR, and (in addition to bias voltage and current) determines the light sensitivity of the device since the gate-current caused by incident light originates within the silicon pellet of the device. If deisred, a two terminal p-n-p-n light activated switch can be used in place of the LASCR's. Such two terminals switches are described in the textbook entitled, "Static Relays for Electronic Circuits" by R. F. Blake, published by Engineering Publishers, of Elizabeth, N.J., in 1960, chapter 18, Library of Congress Catalogue Card No. 60–12808.

With normally applied voltage across its load terminals, the LASCR, which is a three junction p-n-p-n device, has its first and third junctions forward biased so that they can conduct if free charge carriers are present. However, the second or middle junction is reverse biased and normally blocks current flow. Light entering through the window provided in the casing of the LASCR impinges on the silicon pellet and creats free hole-and-electron pairs in the vicinity of the second or middle junction. These free hole and electron pairs are swept across all of the junctions of the device to produce a small current from anode to cathode. As the light increases, this current increases and the current gain of the n-p-n and p-n-p transistor equivalents in the structure also increase. At some point the net current gain exceeds unity and current will increase to a value that is limited only by the external circuit. When conducting current, the forward voltage drop of a LASCR is slightly more than the forward voltage drop of a conventional p-n junction rectifier. When in its nonconducting or current blocking condition the LASCR introduces a substantial impendance (almost infinite) to current flow in a circuit in which it is introduced.

The light controlled power circuit shown in FIGURE 1 further includes a light source 14 for emitting light within the portion of the spectrum to which the LASCR's 11 through 13 respond. The light source 14 preferably comprises an injection and electroluminescent p-n junction, light emitting diode. The light emitting diode 14 preferably is a commercially available light emitting diode such as the infrared-emitting gallium arsenide IR emitter diode, type GAE–406, manufactured and sold by the Microelectrics Division of the Philco Corporation, a subsidiary of Ford Motor Company, Santa Clara, Calif. This device is an infrared light emitting source which emits 40 milliwatts of continuous radiation of a relatively narrow spectral width in the near infrared region when operated at room ambient and with a 2-amp input in the forward direction. It is electrically equivalent to a p-n junction diode. Other types of commercially available light emitting diodes (hereinafter referred to as a LED) also can be satisfactorily used as the light source 14. In this respect it might be noted that the LASCR's 11 through 13 respond to a much greater range of wave lengths than the eye but respond primarily in the near infrared region, and hence constitute a perfect match for the LED 14.

The LED 14 is positioned so that light emitted by the LED is transmitted to the light sensitive junctions of the LASCR's 11 through 13. For this purpose if desired, light coupling arrangements such as a bundle of fiber-optic light coupling elements, a mirror surfaced hollow tube, suitable light transmitting lens arrangements, etc., can be employed to improve the efficiency of light transmission between the LED and the LASCR's. However, for many purposes such ancillary light coupling elements will not be required, and this means can be provided by merely assuring that a suitable direct optical path without interfering or light blocking obstructions exist between the LED 14 and the light sensitive junctions of the LASCR's 11 through 13.

A light interrupting means comprised by a slotted or apertured disk shown at 15 having a plurality of slots or apertures 16 formed therein. The disk 15 is normally opaque to light emitted by the LED 14 with the exception of those places where the slots or apertures 16 are formed. Light passing from the LED 14 through the slots or apertures 16 then is allowed to impinge upon the LASCR's 11 through 13. By appropriate design, light passing through the aperture *16a* can impinge upon the light sensitive junction of LASCR 11 while light passing through the aperture *16b* and *16c* impinges upon the light sensitive junctions of the LASCR's 12 and 13, respectively. Thus it can be appreciated that by rotating the apertured disk 15 as indicated by the arrows 17, turn on of the LASCR's 11 through 13 can be controlled by controlling the timing of impingement of light indicated by the pulsed light flashes shown at 18 on the light sensitive junctions of respective ones of the LASCR's 11 through 13.

In order to rotate the apertured disk 15, a variable speed drive means is provided which includes a variable speed direct current motor 19 connected to the rotatable aperture disk 15 through a shaft 21. Variable speed motor 19 has its armature connected in series with its field winding 22 to a variable tap point 23 of a potentiometer 24. The potentiometer 24 is connected across a low voltage source of direct current comprised by a rectifier 25 and a filter capacitor 26 supplied from a low voltage alternating current supply source indicated by the terminals 27 and 27'. By this arrangement the low voltage alternating current is rectified by rectifier 25, filtered by capacitor 26 and supplied across variable resistor 24. By adjusting the variable tap off point 23, the speed of the motor 19 can be controlled to thereby variably control the timing or point of production of gating-on light pulses supplied by LED 14 through the slots 16*a*, 16*b*, etc. of aperture disk 15 to the light sensitive junction of the respective LASCR's 11 through 13. In order to control the intensity of the light emitted by the LED 14, a variable resistor shown at 28 may be connected in series with LED 14 across the low voltage direct current supply comprised by filter capacitor 26 and rectifier 25. If need be, additional LED's may be provided such as those shown in dotted outline form at 14*a* or, if desired, a series connection of the LED's is possible. By such arrangement, sufficient light intensity at the light sensitive junctions of the LASCR's can be provided to assure positive triggering on of the LASCR's 11 through 13 at appropriate times as determined by the speed of rotating disk 15. Notice also that any D.C. or A.C. supply can be utilized for the motor and LED circuit which will be apparent to those skilled in the art.

As mentioned previously, in order to turn on or render the LASCR's 11 through 13 conductive, it is necessary to supply an enabling potential across the load terminals (shown at 11*a* and 11*b* for the LASCR 11) of each device, concurrently with the impingement of light on the light sensitive surface thereof. For this purpose, a source of alternating current gating potential is provided which is comprised by a high frequency inverter 31 supplied from any convenient low voltage source of direct current potential such as 25, 26. The high frequency inverter 31 may comprise any low cost inverter such as certain of those described in the book entitled "Principles of Inverter Circuits" by B. D. Bedford and R. G. Hoft, published by John Wiley & Sons, Inc., 1964, Library of Congress Catalogue Card No. 64–20078. If desired the high frequency inverter 31 can comprise either a low cost SCR inverter of the type described in the above-identified book by Bedford and Hoft or, alternatively, could comprise a transistor inverter of the type well known in the art.

The high frequency inverter 31 serves to convert the low voltage rectifier direct current supplied from the rectifier 25, and filter capacitor 26 into a high frequency, alternating current potential that is supplied across the primary winding 32 of a gating transformer 33. Gating transformer 33 has at least one secondary winding and preferably has a plurality of secondary windings $34_a$, $34_b$ and $34_c$ and is constructed in accordance with conventional high frequency transformer fabrication techniques to provide as many secondary windings as there are channels to be controlled. Thus, the number of secondary windings $34_a$, $34_b$, etc., would normally correspond to the number of LASCR's employed in the power circuit being controlled. The secondary winding $34_a$ is coupled through the load terminals 11*a* and 11*b* of LASCR 11 across the control gate-cathode of a power rated, gate controlled semiconductor device 35 that preferably comprises a conventional, power rated SCR. Similarly, the secondary windings $34_b$ and $34_c$ are connected through the LASCR's 12 and 13, respectively, across the control gate-cathodes of power rated SCR's 36 and 37. If desired, a conventional full wave rectifier network may be interposed in the circuit intermediate the secondary windings $34_a$, $34_b$, $34_c$ and the LASCR's and thereby double the number of enabling periods.

By the above described arrangement, it will be appreciated that during the alternate, positive half cycles of the high frequency output of inverter 31, each of the secondary windings $34_a$, for example, serves to provide an enabling potential across the load terminals 11*a* and 11*b* of LASCR 11. If at the time that the LASCR 11 is thus enabled, a gating-on light pulse is supplied thereto from LED 14 through the aperture 16*a* in rotating disk 15, the LASCR 11 will be gated on to provide a gating-on pulse to the control gate of the power rated SCR 35. The frequency of the alternating current potentials supplied by inverter 31 to the gating transformer 33 may be chosen such that the period of conduction of the LASCR 11 corresponds to or exceeds the length of time that a gating-on period must be supplied to the power rated SCR 35 in order to render this device conductive. Thus, at the end of a half cycle of the enabling potential supplied across the LASCR 11 by gating transformer 33, the LASCR 11 will be line commutated off in that the alternating current supplied thereto by gating transformer 33 will naturally decline to zero. This results in reducing current flow through the LASCR 11 below its minimum holding value and allows the LASCR to assume its blocking, non-conducting condition. By thus commutating off the LASCR 11, as well as LASCR's 12, 13, etc., no special commutating components are required in the circuit, thereby greatly reducing its complexity, cost, and simplifies its manner of operation.

In the light controlled power circuit arrangement of FIGURE 1 the power rated, gate controlled SCR 35 is connected in series circuit relationship with a load 41 across a pair of high voltage, alternating current, power supply terminals 42 and 42′ which may comprise a high voltage power supply for the load 41. Similarly, the two power rated, gate controlled SCR's 36 and 37 are connected in series circuit relationship with each other, and with a second load 43 across the power supply terminals 42 and 42′. In this latter arrangement, because of the nature of the load 43 it may be desirable to connect two of the power rated gate controlled SCR's 36 and 37 in series with each other and with the load 43 in the manner shown in order to obtain a desired voltage rating. With two power rated SCR's thus connected, it is desirable to provide a load sharing network arrangement comprised by the series connected resistor 44 and capacitor 45 connected across each of the series connected power rated SCR's 36 and 37. This network will then operate in a well known manner to assure proper load sharing in the operation of the two SCR's 36 and 37.

In operation, both branches or subcircuits of the light controlled power circuit of FIGURE 1 operate as well known phase control circuits to control load current flow through the loads 41 and 43, respectively. Because the circuit branch comprised by power rated SCR's 36 and 37 and load 43 will function in precisely the same manner as the circuit branch comprised by power rated SCR 35 and load 41, this description generally will be restricted to a description of the latter branch alone. A detailed description of the technique of phase control may be found in chapter 8 of the textbook entitled "Semiconductor Rectifiers by F. E. Gentry, F. W. Gutzwiler, Nick Holonyak, Jr., and E. E. Von Zastrow, published by Prentice-Hall, Inc., of Englewood Cliffs, N.J., 1964, Library of Congress Catalogue Card No. 64–21172. For the purpose of the present disclosure, the following discussion is believed adequate. As stated above, the high voltage supply coupled across the terminals 42, 42′ is an alternating current supply. In alternating current circuits the SCR is a nearly ideal static power switch for when its anode is positive with respect to its cathode, the SCR can be triggered into a conducting state with a low power gating on signal supplied to its control gate by the LASCR 11, etc. Thereafter the power rated SCR 35 will continue to conduct current in its anode circuit regardless of whether the gate signal is continued or not until the anode current is reduced to zero by the external circuit. Thus, by controlling the turn on time of the power rated SCR 35 relative to the phase of the supply alternating current potential appearing across 42, 42′, the SCR 35 can be used to proportionally control power flow through the load 41. Similarly, by controlling the turn on time of the SCR's 36 and 37, which incidentally must turn on simultaneously by appropriate design of the slots 16*b* and 16*c* in disk 15, relative to the phase of the high voltage supply 42, 42′, load current flow through the load 43 can be proportionally controlled.

From the above brief description, it can be appreciated that the frequency of the alternating current supply to the gating transformer 33 is adjusted to be relatively high with respect to the frequency of the high voltage supply 42, 42'. This frequency however must be sufficiently low to allow a sufficient gating-on period of the LASCR 11 to produce an adequate gating-on pulse in the power rated SCR 35. Thus, it will be appreciated that for each half cycle of the high voltage supply 42, 42' when the anode of the power rated SCR 35 is enabled by appropriate polarity, the anode of the LASCR 11 will be enabled a great many hundreds or thousands of times. The LASCR 11 will not be rendered conductive however until the slot 16*a* in aperture disk 15 allows light from the LED 14 to impinge on the light sensitive junction of LASCR 11. Upon this occurrence and simultaneous appearance of enabling gating potentials across the load terminals 11*a* and 11*b*, the LASCR 11 will be rendered conductive and apply a gating on potential to the control gate of the power rated SCR 35. As previously stated the period of the gating potential supplied through gating transformer 33 is sufficiently long to assure gating on of the power rated SCR 35. Thereafter the power rated SCR 35 will be rendered conductive to proportionally control load current flow through the load 41 in the above briefly described manner. By controlling the speed of rotation of disk 15 the precise point in the phase of the high voltage supply alternating potential 42, 42' at which power rated SCR 35 is rendered conductive, can be precisely controlled. The LASCR's 12 and 13 operate in a similar fashion to control the point of turn-on of the power rated SCR's 36 and 37 relative to the phase of the high voltage alternating current supply potential. If desired any number of output channels can be thus provided in connection with a single rotatable disk controlling element 15 by appropriate design of the slots 16*a*, 16*b*, etc., in the disk 15. Hence, it can be appreciated that the invention lends itself to a multichannel control but is in no way restricted to use with plural channel control systems. Because of the high frequency at which it is operated, the gating transformer 33 can be fabricated much more cheaply than conventional lower frequency transformers. Similarly, the LASCR's, the LED, the high frequency inverter 31, and the variable speed motor 19 and disk 15 all constitute low cost elements which make possible a relatively simple, inexpensive, and yet reliable in operation light activated gating circuit for use in gating on gate controlled power semiconductor devices.

Figure 2:
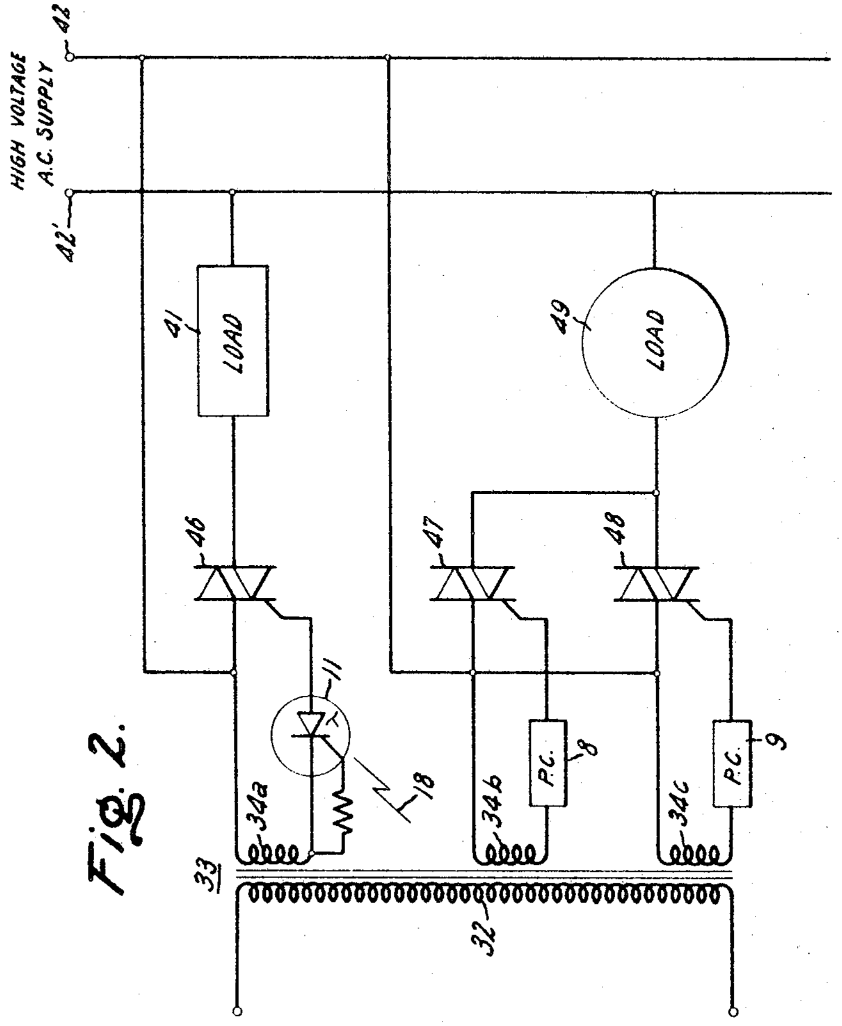
FIGURE 2 is a schematic circuit diagram of a modification of the circuit shown in FIGURE 1.

FIGURE 2 of the drawings ilustrates a modified form of the circuit shown in FIGURE 1 wherein the light controlled power circuitry components are somewhat different from those employed in the circuit arrangement of FIGURE 1. In other respects, the circuit of FIGURE 2 would employ a low cost, light activated gating circuitry arrangement identical to the one shown in FIGURE 1 up to the gating transformer 33. At this point it can be seen that the output form the LASCR 11 is connected to the control gate of a power rated gate controlled bidirectional conducting device 46. However, in place of LASCR's 12 and 13 light activated control elements 8 and 9 are employed to supply gating on signals to control gates of a pair of parallel connected bidirectional conducting devices 47 and 48. The power rated, gate controlled bidirectional conducting semiconductor devices 46, 47, and 48 each comprise power rated triac bilateral triode switches of the type described in chapter 3 of the above entitled "Semiconductor Controlled Rectifiers" textbook by F. E. Gentry et al. The light activated control elements may comprise photoconductors or photoresistors fabricated from compositions such as lead, or zinc sulphide, telluride or selenide, or other suitable photosensitive member that exhibit substantially infinite impedance in the absence of light, and upon the impingement of light thereon becomes highly conductive.

The triac 46 is connected in series circuit relationship with load 41 across the high voltage alternating current supply terminals 42 and 42'. The triacs 47 and 48 are connected in parallel circuit relationship with each other, with the parallel circuit thus formed being connected in series with load 49 across the high voltage alternating current supply terminals 42 and 42'. By this later arrangement, current required by the load 49 is supplied from the parallel triacs 47 and 48. If desired, load current sharing network arrangements similar to those shown in FIGURE 1 may be employed in connection with the parallel connected triacs 47 and 48 to force load current sharing.

In operation the circuit arrangement of FIGURE 2 functions in a similar manner to the circuit of FIGURE 1 to proportionally control the load current supplied through the load 41 by the triacs 46, 47, 48, etc. There is a difference however in that the triacs 46, 47 and 48 constitute bilateral gate control switches capable of allowing load current flow in either direction through the load 41. Thus, while the circuit arrangement of FIGURE 1 is capable of proportionally controlling the load current flow through the load only during alternate half cycles, the circuit arrangement of FIGURE 2 is capable of providing full wave, proportionally controlled load current flow during both alternate half cycles of the high voltage, alternating current supply appearing across terminals 42 and 42'. In other respects, the two circuits are entirely similar.

FIGURE 3 of the drawings illustrates still another embodiment of the invention wherein a low cost, light activated gating circuit is employed to trigger on the power rated, conventional gate controlled semiconductor devices of a high voltage inverter. A single phase inverter for converting direct current voltage to alternating current voltage normally requires four, power rated, gate controlled semiconductor devices such as those shown at 52, 53, 54 and 55 connected across a source of high voltage direct current electric potential 50. The power rated gate controlled semiconductor devices 52 through 55 are in fact power rated SCR's wherein the SCR's 52 and 54 are connected in series circuit relationship across the high voltage direct current power supply 50 in parallel with the series connected SCR's 53 and 55. A load 56 is connected between the juncture of the SCR's 52 and 54 and the juncture of the SCR's 53 and 55. It can be appreciated that by alternately turning on first the SCR's 52 and 55, thereafter turning off these two SCR's and turning on and off the SCR's 53 and 54, and repeating the process, the terminals of the load 56 will be alternately connected across opposite terminals of the high voltage direct current supply 50. In this manner an alternating current will be developed across the load 56.

In order to gate on the power rated SCR's 52 through 55 in the above described fashion, four LASCR's 11 through 13 and 51 are provided. The LASCR's 11 through 13 and 51 have their load terminals connected through respective associated secondary windings 34*a* through 34*d*, of gating transformer 33 across the control gate-cathodes of the power rated SCR's 52 through 55, respectively. The LASCR's 11 through 13 and 51 are arranged so that their light sensitive junctions are in the paths of light rays indicated at 18 emitted from the LED 14 through apertured slots 57*a* through 57*d* formed in an opaque rotating disk 57. The slots 57*a* through 57*d* are arranged such that light first impinges on the light sensitive junctions of LASCR's 11 and 13, and 180 electrical degrees later relative to the voltage across load 56, light impinges on the light sensitive junctions of the LASCR's 12 and 51 concurrently. By controlling the rotational speed of the disk 57, the frequency of turn on of the LASCR's 11 through 13 and 51, and hence the frequency of turn on of their associate power rated SCR's 52 through 55, can be controlled to thereby control the frequency of the alternating current output appearing across load 56. For this purpose, rotating disk 57 is controlled by a variable speed alternating current motor 58 connected to the disk 57 through a shaft 59. The speed of the variable speed alternating current 58 is in turn controlled by a variable frequency inverter 61 supplied from the source of low voltage direct current potential 25, 26.

Because the power rated SCR's 52 through 55 are supplied from a high voltage direct current source of potential, it is necessary to provide some means for commutating these devices off at the end of a predescribed interval of conduction. For this purpose commutating circuits shown at 62 through 65 are connected across each of the respective power rated SCR's 52 through 55. The design and operation of the commutating circuits 62 through 65 may take any form such as those described in the above referenced textbook entitled "Principles of Inverter Circuits" by Bedford and Hoft. The frequency of operation of the commutation circuits 62 through 65 must be designed sufficiently fast to assure proper turn off of the power rated SCR's 52 through 55 prior to turn on of an opposite pair within the desired range of frequencies at which the circuit is to be operated. To say it another way, the commutation frequency of the commutating circuits 62–65 must be extremely high with respect to the range of operating frequencies of the inverter.

In operation the circuit of FIGURE 3 functions in much the same manner as the circuit of FIGURE 1 with the exception that the speed of the rotating disk 57 is controlled by controlling the frequency of the output of the variable frequency inverter 61. Additionally, the disk 57 must be designed such that the firing times of the LASCR's 11 through 13 and 51 are properly timed relative to each other as well as to the requirements of the load which they are controlling. In all other respects, the two circuits operate similarly. The FIGURE 3 circuit does, however, serve to illustrate the wide variety of power circuits which can be designed to employ the low cost, light activated gating arrangement made possible by the present invention.

FIGURE 4 of the drawings illustrates an embodiment of the invention which is entirely similar in construction and operation to the power circuit shown in FIGURE 1 with the exception of the construction and operation of the light emitter portion of the circuit. Consequently, with regard to the light gated power portion of the circuit shown in FIGURE 4, all of these elements are identical to the correspondingly numbered elements in FIGURE 1, and function in precisely the same manner. However, with respect to the light emitter portion of the circuit, light emitted by the light emitting diode 14 is supplied through a plurality of fiber optic, light coupling elements 75 through 78 which serve to couple the light emitted by LED 14 to a plurality of light modulator devices 79, 81, 82 and 83. The output of the light modulator devices is then supplied through output fiber optic, light coupling elements 84 through 87 to an associated LASCR 11 through 13. Light supplied through the fiber optic coupling elements 84 and 87 serves to trigger on the LASCR's 11 through 13 in precisely the same manner as the light pulses supplied to the correspondingly numbered elements in the FIGURE 1 circuit through the variable speed rotatable disk 15. It might be noted that the additional light coupling paths 85 and 86 are illustrated only to indicate how the low cost, light activated gating circuit can be readily modified to provide additional branch circuits or subcircuits as required by a particular job specification.

The light modulator devices 79 through 83 may comprise commercially available electro-optic devices identified as the model 131–EOLM–KDP crystal for use as a light modulator. This assembly comprises a KDP crystal fixed between two cylindrical electrodes, and capable of controlling light transmission through the crystal by the application of electric potentials across the cylindrical electrodes. Such a device is manufactured and sold by the Optik Electric Corporation, 34—32 57th St., Woodside, N.Y. By reason of the characteristics of the KDP crystal modulators 79 through 83, light emitted by the LED 14 can be selectively blocked or transmitted from the LED

14, fiber optic coupling elements 75 and 78 through the KDP crystal and the fiber optic coupling elements 84 and 87 to the LASCR's 11 through 13, by the selective application of controlling potentials to the electrodes of the KDP crystal modulators 79–83. For this purpose the electrodes of the KDP crystals 79 and 83 are connected back to the outputs of two variable frequency multivibrators 88 and 89, respectively, whose outputs control the condition of the KDP crystal modulators 79, and 83. Accordingly, depending upon the value of the potential supplied from the output of the variable frequency multivibrators 88 and 89, the KDP crystal modulators 79 and 83 will be either light transmissive or will operate to block the transmission of light therethrough. By selectively controlling the condition of the KDP crystal modulators it will be appreciated therefore that selective control over the gating of the LASCR's 11 through 13, is provided. In all other respects, the operation of the circuit of FIGURE 4 is similar to the operation of the FIGURE 1 circuit and will not be repeated.

It might also be noted that while the light modulators 79 through 83 are described as comprising KDP crystals, the light modulators can comprise any other form of electrically actuated device capable of blocking and unblocking a light transmission path through the device. For example, the light modulator 79 through 83 could comprise a magneto-optic device manufactured and sold by the Marks Polarizer Corporation of New York city. This magneto-optic device comprises a bundle of small magnetizable needles suspended in a liquid medium. In its unmagnetized mode or condition the magneto-optic device generally cuts off the transmission of all light through the device by reason of the random arrangement of the needles suspended in the liquid medium. However, upon the application of a controlling electric signal to the device the magnetizable needles become longitudinally aligned with the light transmission paths and transmits light therethrough. Other similar devices could be employed equally well as the light modulators 79 through 83 in the arrangement shown in FIGURE 4.

From the foregoing description it can be appreciated that the present invention provides new and improved low cost light activated gating circuits for gate controlled power semiconductors which are simple and inexpensive to manufacture and operate in a reliable manner. Because of the light coupling feature employed in the low cost gating circuits, complete isolation between the input control and the output power being controlled is entirely feasible. Hence, entirely new light controlled semiconductor power circuits are made possible which are relatively low cost, simple to manufacture and to operate, and are reliable in operation.

Having described several embodiments of new and improved low cost, light activated gating circuits constructed in accordance with the invention, it is believed obvious that other modifications and variations of the present invention are possible in the light of the above teachings. It is therefore to be understood that changes may be made in the particular embodiments of the invention described which are within the full intended scope of the invention as defined by the appended claims.

What I claim as new and desire to secure by Letters Patent of the United States is:

1. A low cost, light activated gating circuit for a plurality of power semiconductor thyristors comprising a source of low voltage direct current electric potential, a high frequency inverter energized by the source of low voltage direct current electric potential and having its low voltage alternating current potential output connected across the primary winding of a gating transformer that in turn has a plurality of secondary windings, a plurality of light activated control elements including at least one light activated control thyristor each effectively coupled across one of said gating transformer secondary windings through one of the power semiconductor thyristors, a single light source electrically energized to continuously emit light within the portion of the spectrum to which the light activated control elements respond, means for directing light from the light source onto the light sensitive surface of each light activated control element, and controllable light interrupting means selectively interposed in the light path between said light source and each light activated control element for individually controlling the turn-on of the light activated control elements in a selected sequence and at a desired variable repetition rate.

2. A gating circuit according to claim 1 wherein each of the light activated control elements comprises a light activated silicon controlled rectifier, and wherein said gating transformer supplies an enabling potential to said light activated silicon controlled rectifiers to cause conduction through each device upon the impingement of a light beam on the light sensitive junction thereof, each conducting device being commutated off automatically when the potential across said gating transformer changes polarity, and the light source is a light emitting semiconductor diode.

3. A gating circuit according to claim 1 wherein said light source is a light emitting semiconductor diode, and said controllable light interrupting means comprises an opaque disk having apertures formed therein for selectively interrupting the light path to each light activated control element and further includes variable speed electric motor for rotating said apertured disk at a selected speed.

4. A gating circuit according to claim 3 wherein said variable speed electric motor and said light emitting diode are both energized by the source of low voltage direct current electric potential, and said source of low voltage direct current electric potential comprises a half wave rectifier that is in turn adapted to be connected across a source of low voltage alternating current electric potential.

5. A gating circuit according to claim 1 wherein said controllable light interrupting means comprises a plurality of electrically operable light modulators each imposed in the light path between said light emitting diode and each light activated control element, and variable electric control circuit means operatively coupled to and controlling said light modulators.

6. A light controlled power circuit including in combination an electrical load, and a low cost gating circuit of the type defined in claim 1 wherein the power semiconductor thyristors are operatively coupled to said load and to a high voltage power source for controlling power supplied to the load, said high voltage power source having a frequency that is low as compared to the frequency of said inverter, and the light source in the gating circuit is a light emitting semiconductor diode.

7. A light controlled power circuit according to claim 6 wherein said power semiconductor thyristors are gate controlled power rated thyristors, and each light activated control element is operatively coupled with one of said gating transformer secondary windings across the control gate and a load terminal of one of the gate controlled power rated thyristors.

References Cited

UNITED STATES PATENTS

| | | | |
|---|---|---|---|
| 2,111,014 | 3/1938 | Vedder | 315—156 X |
| 2,169,818 | 8/1939 | Scott | 315—156 X |
| 2,193,789 | 3/1940 | Braselton | 315—156 X |
| 2,730,657 | 1/1956 | Rockafellow | 315—174 X |

OTHER REFERENCES

Silicon Controlled Rectifier Manual, F. W. Gutzwiller, editor, third edition, published by General Electric Company, Rectifier Components Department, W. Genesee St., Auburn, N.Y., Mar. 23, 1964, pages 211, 209, and 217.

JAMES W. LAWRENCE, Primary Examiner

C. R. CAMPBELL, Assistant Examiner

U.S. Cl. X.R.

250—206, 211, 233; 307—311; 315—156, 174